(12) United States Patent
Arik et al.

(10) Patent No.: US 7,969,734 B2
(45) Date of Patent: Jun. 28, 2011

(54) UNIQUE COOLING SCHEME FOR ADVANCED THERMAL MANAGEMENT OF HIGH FLUX ELECTRONICS

(75) Inventors: Mehmet Arik, Niskayuna, NY (US);
Chellappa Balan, Niskayuna, NY (US);
Todd Garrett Wetzel, Niskayuna, NY (US); Stephen Adam Solovitz, Portland, OR (US); Charles Max Byrd, White Plains, NY (US); Stanton Earl Weaver, Jr., Northville, NY (US)

(73) Assignee: General Electric Company, Niskayuna, NY (US)

(*) Notice: Subject to any disclaimer, the term of this patent is extended or adjusted under 35 U.S.C. 154(b) by 503 days.

(21) Appl. No.: 11/649,173

(22) Filed: Jan. 3, 2007

(65) Prior Publication Data
US 2008/0156462 A1    Jul. 3, 2008

(51) Int. Cl.
*H05K 7/20* (2006.01)
(52) U.S. Cl. ........ 361/697; 361/690; 361/694; 361/695; 361/702; 165/80.3; 165/908; 62/259.2
(58) Field of Classification Search .......... 361/688–690, 361/692, 694–697, 699, 700, 702
See application file for complete search history.

(56) References Cited

U.S. PATENT DOCUMENTS

| | | | |
|---|---|---|---|
| 4,912,600 A * | 3/1990 | Jaeger et al. | 361/700 |
| 5,001,548 A * | 3/1991 | Iversen | 257/714 |
| 5,094,594 A | 3/1992 | Brennan | 417/413.2 |
| 5,666,817 A | 9/1997 | Schulak et al. | 62/185 |
| 5,719,444 A * | 2/1998 | Tilton et al. | 257/714 |
| 6,808,371 B2 * | 10/2004 | Niwatsukino et al. | 417/353 |
| 7,010,930 B2 | 3/2006 | Arik et al. | 62/259.2 |
| 7,334,630 B2 * | 2/2008 | Goodson et al. | 165/104.33 |
| 7,495,914 B2 * | 2/2009 | Tilton et al. | 361/699 |
| 2004/0104012 A1 * | 6/2004 | Zhou et al. | 165/104.26 |
| 2006/0026983 A1 * | 2/2006 | Tilton et al. | 62/310 |
| 2007/0295481 A1 * | 12/2007 | Campbell et al. | 165/80.4 |

* cited by examiner

*Primary Examiner* — Jayprakash N Gandhi
*Assistant Examiner* — Courtney Smith
(74) *Attorney, Agent, or Firm* — Patrick K. Patnode

(57) ABSTRACT

Disclosed is a system for cooling an electronics package. The system includes a fluid pump and a microcooler assembly. The system utilizes one or more cooling layers interspersed with layers of electronics in the electronics package. Each cooling layer has an array of cooling channels formed in a substrate, an input manifold through which cooling fluid is provided for distribution through the array of cooling channels, and an output manifold which collects fluid from the array of cooling channels. The elements of the cooling system are integrated by conduits including a package conduit for passage of fluid from the fluid pump to the electronics package, a cooler conduit for passage of fluid from the electronics package to the microcooler assembly, and a pump conduit for passage of fluid from the microcooler assembly to the fluid pump. Also disclosed is a method for cooling the electronics package.

25 Claims, 5 Drawing Sheets

UNIQUE COOLING SCHEME FOR ADVANCED THERMAL MANAGEMENT OF HIGH FLUX ELECTRONICS

BACKGROUND

The subject invention relates to a cooling system for high performance electronic devices. More particularly, the invention relates to an improved fluid cooling system for high performance electronic devices that includes an improved pump and improved heat rejection component.

Many high performance electronic devices require a cooling system to prevent components, such as microprocessors, from overheating, and to improve reliability and efficiency of such components. One method for cooling such components is by utilizing a heatsink and fan combination. The heatsink is disposed in contact with the component to be cooled and conducts heat away from the component. The fan moves a volume of air across the heatsink removing heat from the heatsink and into the air by convection. As microprocessors become faster and more densely packed, more heat is generated by the microprocessors and the size of the heatsink and fan combination must be increased in order to provide the necessary cooling.

An alternative to the heatsink and fan combination is a fluid cooling system. A fluid cooling system may include fluid-cooled heat sink plates that can increase heat flux performance of the system by an order of magnitude compared with air-cooled designs, thus reducing the size of heat sink required to achieve a required heat flux. The addition of heat pipes, impinging sprays, and two-phase cooling can further improve performance of the fluid cooling system. The fluid cooling system may include a substrate with channels formed into it that is disposed at the microprocessor. Cooling fluid is pumped through the channels and conducts heat from the microprocessor. The heated fluid then proceeds away from the microprocessor to a remotely located heat dissipater, for example a heatsink and fan combination. There the heat is dissipated into the atmosphere by the fan moving a volume of air over the heatsink, and the fluid is cooled. The cooled fluid is then pumped back to the microprocessor channels. As heat generated by microprocessors increases, fluid pressure provided by the pump and air volume moved by the fan must be increased to provide adequate cooling. Conventional pumps and fans that meet these requirements can be undesirably noisy as well as too large to meet the size requirements for the overall electronics device.

What is needed is a fluid cooling system for high performance electronics components capable of removing an adequate amount of heat in order to maintain the functionality of the electronics, and that can be packaged into a smaller volume than a comparable conventional fluid cooling system.

BRIEF DESCRIPTION OF THE INVENTION

The present invention solves the aforementioned problems by providing an improved system for cooling an electronics package. The system utilizes one or more cooling layers interspersed with layers of electronics in the electronics package. Each cooling layer comprises an array of cooling channels formed in a substrate, an input manifold having a plurality of input manifold arms through which cooling fluid is provided for distribution through the array of cooling channels, and an output manifold having a plurality of output manifold arms which collect fluid from the array of cooling channels. The system includes a fluid pump and a microcooler assembly including a turbomachine which forces a volume of air across a heatsink. The elements of the cooling system are integrated by conduits including a package conduit for passage of fluid from the fluid pump to the electronics package, a cooler conduit for passage of fluid from the electronics package to the microcooler assembly, and a pump conduit for passage of fluid from the microcooler assembly to the fluid pump.

The system cools the electronics in the electronics package by pumping fluid from the fluid pump through the package conduit to the input manifold disposed at the electronics package. The fluid is distributed to one or more cooling layers interspersed with one or more electronics layers in the electronics package and through the input manifold arms into the array of cooling channels. The fluid absorbs heat in the electronics package as the fluid is forced through the array of cooling channels. The fluid is collected in the output manifold arms and continues through the output manifold and further through the cooler conduit to the heatsink of the microcooler assembly. The heatsink absorbs heat from the fluid, and the heat is radiated from the heatsink to ambient air by utilizing the turbomachine to force a volume of air across the heat sink. The fluid then continues back to the fluid pump through the pump conduit.

These and other objects of the present invention will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
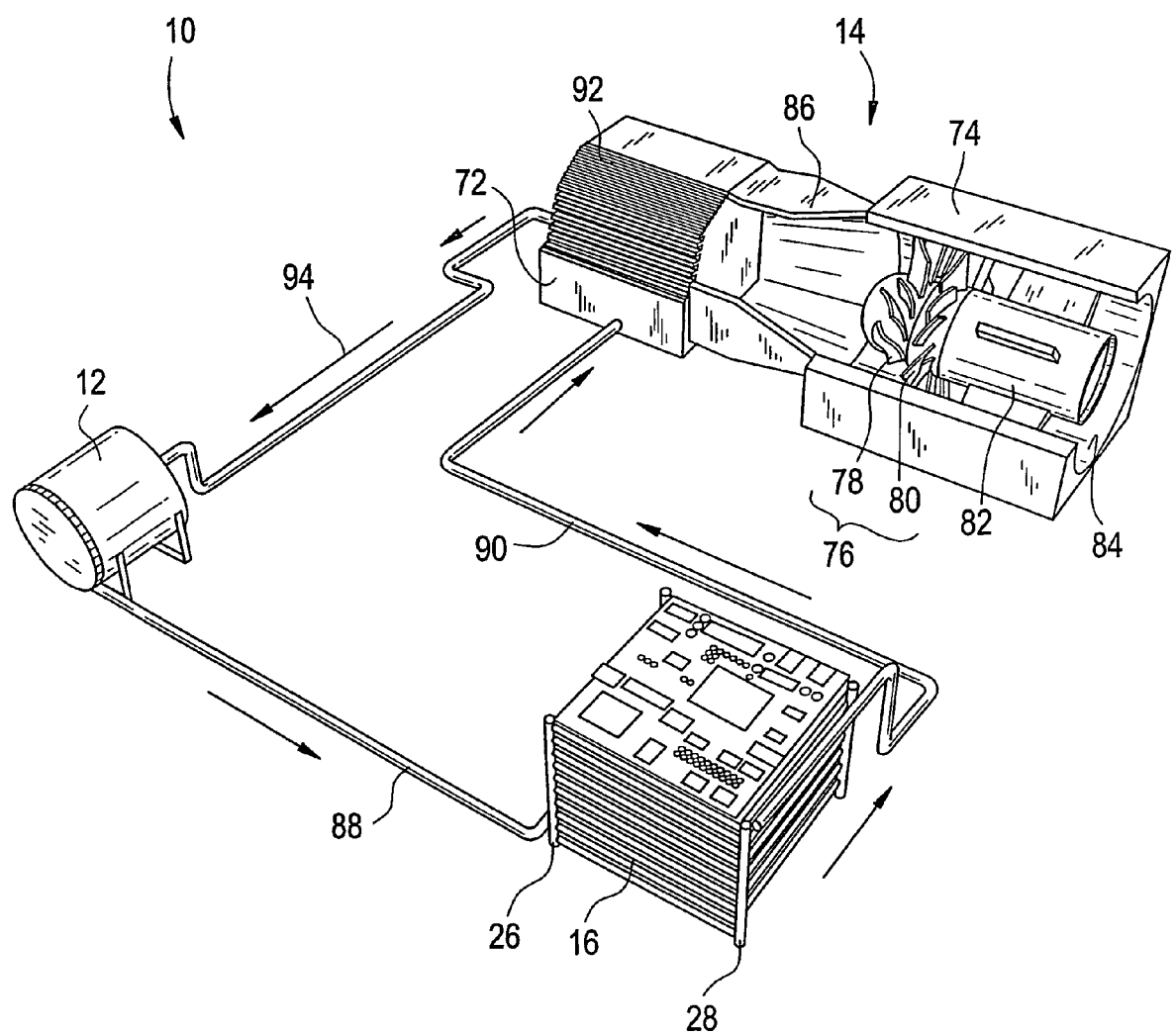
FIG. 1 is an illustration of a compact cooling system for high flux electronics.
Figure 2:
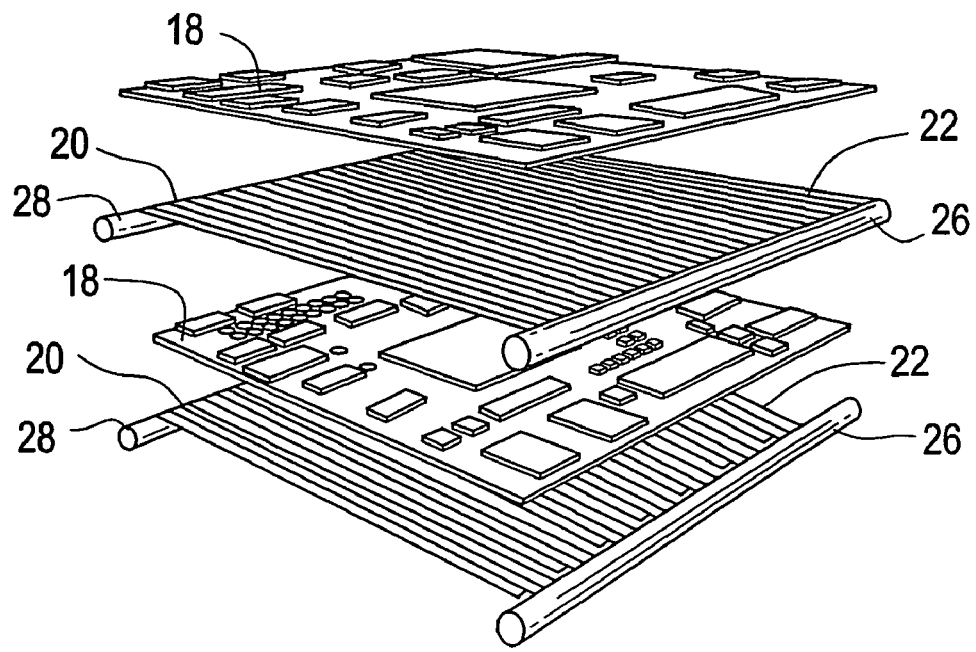
FIG. 2 is an exploded view of an electronics circuit cooled by the system of FIG. 1.
Figure 3:
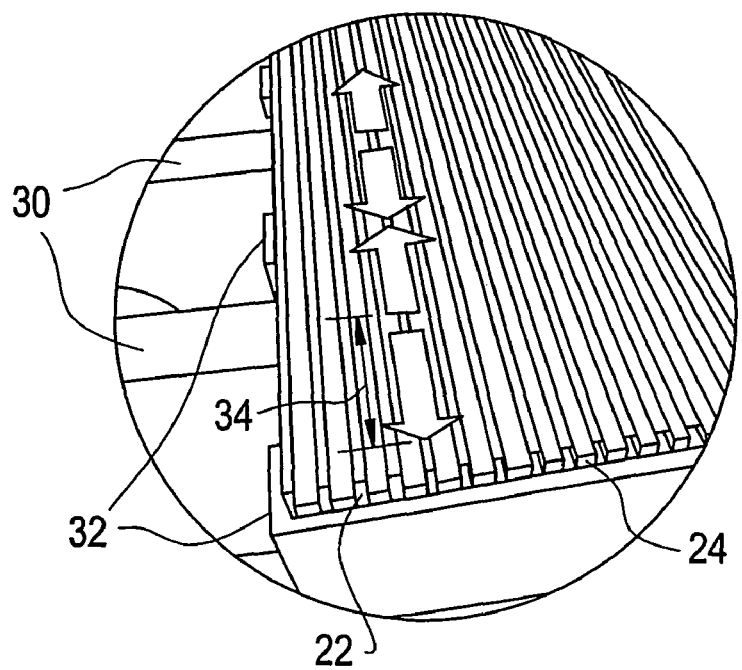
FIG. 3 is a partial view of cooling channels of the system on FIG. 1.

Referring to FIG. 1, enhanced fluid cooling system 10 comprises a fluid pump 12 and a microcooler 14 to cool an electronics package 16. As shown in FIG. 2, the electronics package 16 includes one or more electronics layers 18 which may contain a variety of components, for example a processor can be combined at chip level with DRAM, flash memory and resistors/capacitors. One or more cooling layers 20 are interspersed with the one or more electronics layers 18. Each cooling layer 20 includes an array of channels 22. Arrangement of the array of channels 22 may vary with the application and the cooling requirements of a particular component. As an example, the channels 22 in FIG. 2 are substantially parallel to one another. As shown in FIG. 3, the channels 22 are formed in a substrate 24. The substrate may be formed from a variety of materials, including silicon, ceramic materials, metallic materials, glass, or combinations thereof. The channels 22 may be formed in the substrate 24 by etching or by some other means. The channels 22 may have various diameters. For example, the channels 22 may have diameters of less than 3 mm, or the channels 22 may have diameters of less than 300 microns. Returning again to FIG. 2, the one or more cooling layers 20 also include an input manifold 26 for providing low temperature fluid to each of the cooling layers 20, and an output manifold 28 for outputting high temperature fluid from each of the cooling layers 20. Although the specific dimensions of the input manifold 26 and output manifold 28 may vary based on cooling requirements and the application, in one example the input manifold 26 and output manifold 28 have a diameter of about 2 millimeters.

In each cooling layer 20, the fluid flows from the input manifold 26 and, referring now to FIG. 3, into a plurality of input manifold arms 30 which are disposed in the cooling layer 20 to provide fluid to the channels 22. In the example shown in FIG. 3, the input manifold arms 30 are disposed perpendicular to and substantially coplanar with the channels 22. The fluid flows from the input manifold arms 30 into the array of channels 22 where it conducts heat from the electronics layer 18 and is heated. The heated fluid then enters a plurality of output manifold arms 32 which are disposed in the cooling layer 20 to collect fluid from the channels 22. In he example shown in FIG. 3, the output manifold arms 32 are disposed perpendicular to and coplanar with the channels 22 and are interspersed with the input manifold arms 30. In one example, the input manifold arms 30 and output manifold arms 32 have substantially rectangular cross sectional shapes, but other cross sectional shapes, such as circular, are contemplated. In some embodiments, the cross section of each input manifold arm 30 and output manifold arm 32 may be constant along its length, or the cross section may taper or otherwise vary. The heated fluid is carried through the output manifold arms 32 and into the output manifold 28. The interspersed arrangement of the input manifold arms 30 and the output manifold arms 32 greatly shortens a heatsink link 34 (the distance fluid travels in a channel 22) to, in one example, less than about 1 centimeter, and therefore improves thermal performance of the cooling system 10. Furthermore, the perpendicular arrangement of the input manifold arms 30 and output manifold arms 32 relative to the channels 22 simplifies manufacture and assembly of the cooling layers 20.

Figure 4:
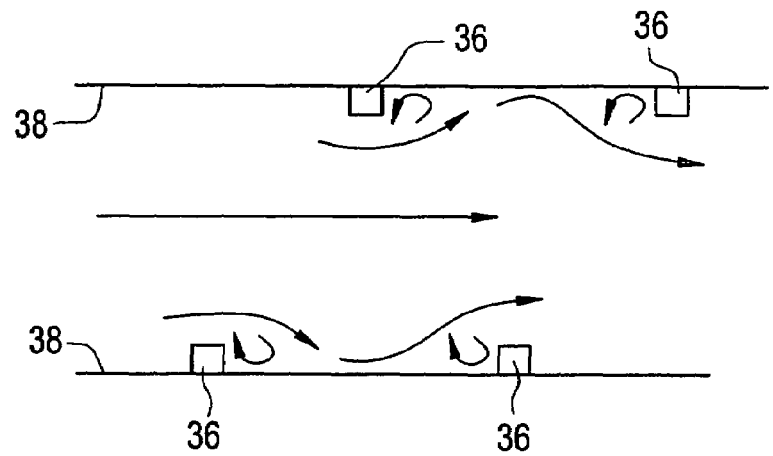
FIG. 4 is an example of a surface treatment of a cooling channel of FIG. 3.
Figure 5:
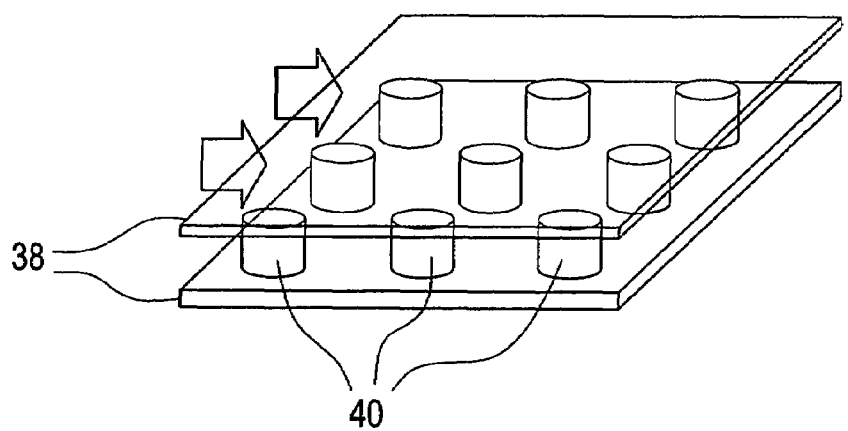
FIG. 5 is another example of a surface treatment of a cooling channel of FIG. 3.
Figure 6:
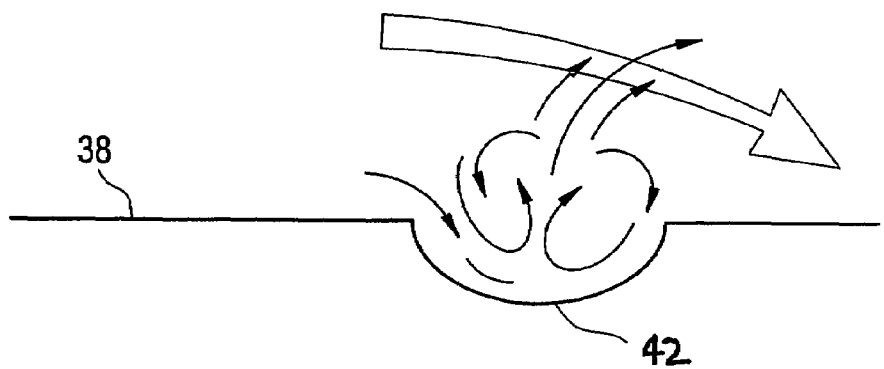
FIG. 6 is yet another example of a surface treatment of a cooling channel of FIG. 3.

In some embodiments, each channel 22 may have one or more surface treatments applied to it to enhance the performance of the cooling system 10. Examples of surface treatments are shown in FIGS. 4-6. As shown in FIG. 4, turbulators 36 are small protrusions extending from the inner walls 38 of the channel 22 into the fluid flow. As shown in FIG. 5, micro pin fins 40 are cylindrically shaped protrusions arrayed across the channel 22 and extending completely between the inner walls 38 creating periodic flow obstructions across the fluid flow. Another example of surface treatments, shown in FIG. 6 is dimples 42. Dimples 42 are concave features in the inner walls 38 and are disposed periodically along the inner walls 38. The treatments described above, as well as others including vortex cooling, controlled roughness, and local jets, may be used alone or in combination to introduce turbulence to the fluid flow in the channels 22 thereby increasing the cooling performance of the channels 22.

Figure 7:
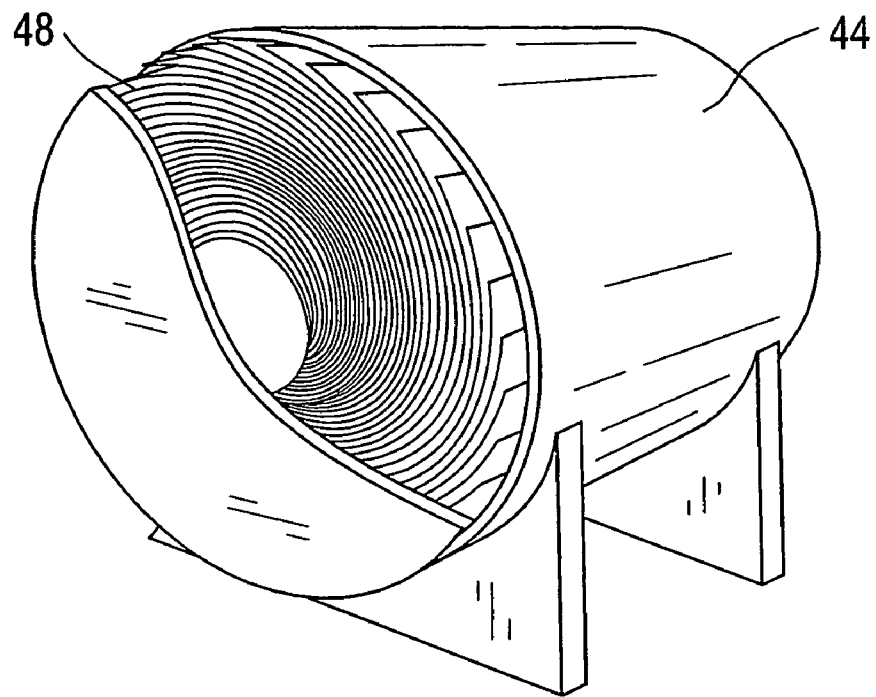
FIG. 7 is a perspective view of a viscous shear pump utilized in one embodiment of the system of FIG. 1.
Figure 8:
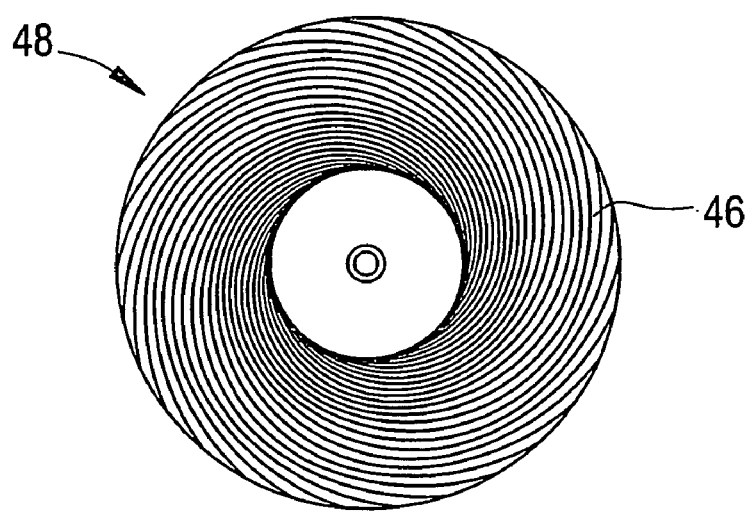
FIG. 8 is a detail end-view of the interior of an example of a viscous shear pump of FIG. 7.

Returning to FIG. 1, increased pressure losses in the channels 22 require greater pumping pressures which would result in a substantial pump size increase with conventional pumping techniques. An example of a fluid pump 12 capable of pumping at a flow rate and a pressure necessary for performance of the cooling system 10 is a viscous shear pump 44, shown in FIG. 7. As shown in FIG. 7, the viscous shear pump 44 includes herringbone-spiral grooves 46 disposed on a rotating element 48 of the viscous shear pump 44. In addition to actively pumping the fluid, the grooves 46 increase the stability of the viscous shear pump 44 compared to non-grooved, hydrodynamically lubricated journal and thrust bearings. The viscous shear pump 44 provides the higher flow pressures needed to adequately remove the heated fluid from the channels 22, and is able to do so with a pump $\frac{1}{5}^{th}$ the size of a comparable conventional fluid pump.

Figure 9:
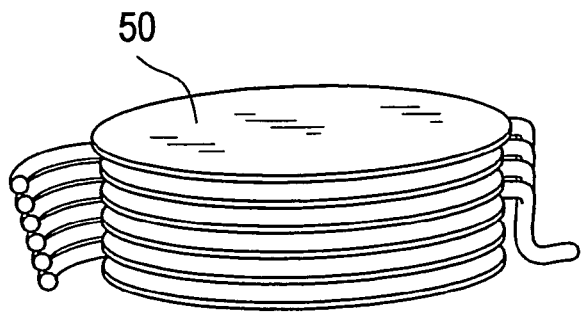
FIG. 9 is a perspective view of a synthetic jet pump utilized in one embodiment of the system of FIG. 1.
Figure 10:
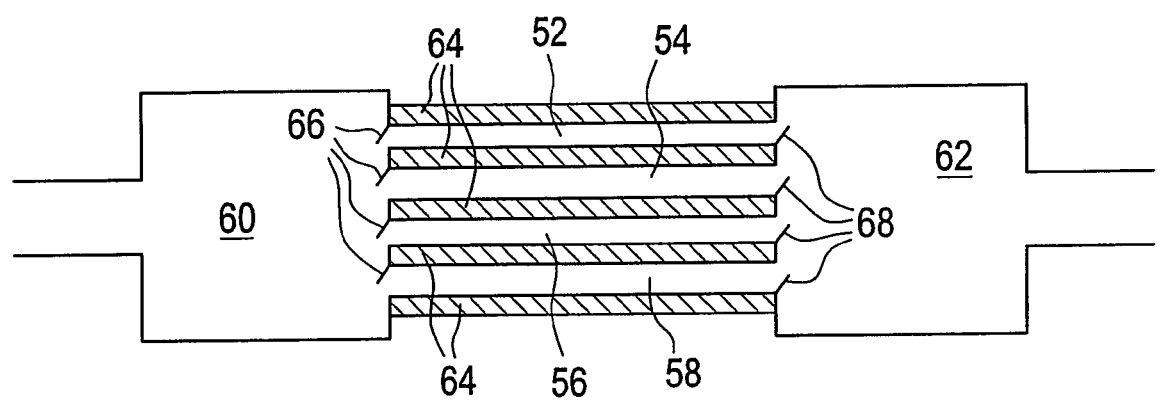
FIG. 10 is a cross-sectional view of the synthetic jet pump of FIG. 9.

In some embodiments of the cooling system 10, the fluid pump 12 may comprise a synthetic jet pump 50, an example of which is shown in FIG. 9. The synthetic jet pump 50 is a piezo-based pump which, as shown in FIG. 10, includes a plurality of pump chambers 52, 54, 56, 58 extending from an input chamber 60 to an output chamber 62, with adjacent pump chambers separated by a deformable membrane 64. An input valve 66 is disposed at each pump chamber 52, 54, 56, 58, between the pump chamber 52, 54, 56, 58 and the input chamber 60. An output valve 68 is disposed at each pump chamber 52, 54, 56, 58 between the pump chamber 52, 54, 56, 58 and the output chamber 62. An actuator (not shown), for example a piezo or magnetic actuator, is mechanically coupled to at least a portion of each deformable membrane 64. When an electrical signal is transmitted to each actuator, the actuator causes each deformable membrane 64 to deform, either expanding or contracting each pump chamber 52, 54, 56, 58. For example, the actuators in synthetic jet pump 50 are disposed such that when activated, pump chamber 52 contracts and expels fluid through output valve 68 into output chamber 62, pump chamber 54 expands and draws fluid into pump chamber 54 from the input chamber 60 through input valve 66, pump chamber 56 contracts and expels fluid through output valve 68 into output chamber 62, and pump chamber 58 expands and draws fluid into pump chamber 58 from the input chamber 60 through input valve 66. When the actuators are de-activated, each pump chamber 52, 54, 56, 58 returns to its pre-actuated state. Pump chamber 52 expands and draws fluid into pump chamber 52 from the input chamber 60 through input valve 66, pump chamber 54 contracts and expels fluid through output valve 68 into output chamber 62, pump chamber 56 expands and draws fluid into pump chamber 56 from the input chamber 60 through input valve 66, and pump chamber 58 contracts and expels fluid through output valve 68 into output chamber 62.

Figure 11:
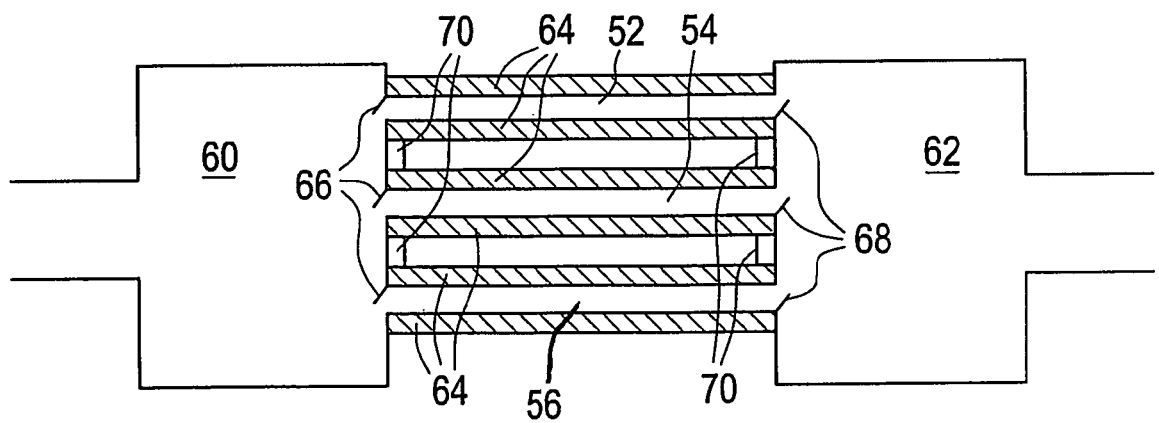
FIG. 11 is a cross-sectional view of another example of a synthetic jet pump used in one embodiment of the system of FIG. 1.

Another example of a synthetic jet pump 50 is shown in FIG. 11. In this example, pump chambers 52, 54, 56 are separated by two deformable membranes 64 with a spacer 70 therebetween. When the actuators are activated, pump chambers 52, 54, 56 expand and draw fluid into pump chambers 52, 54, 56 from input chamber 60 through input valves 66. When the actuators are deactivated, pump chambers 52, 54, 56 contract to their pre-actuated state and expel fluid through output valves 68 into output chamber 62. Inclusion of the spacers 70 allows the pump chambers 52, 54, 56 to expand and contract in unison further improving performance of the synthetic jet pump 50.

Returning to FIG. 1, the microcooler 14 is used to reduce the temperature of fluid heated by the electronics package 16 and to dissipate the heat into the atmosphere. The microcooler 14 comprises a heatsink 72 and a high powered turbomachine 74. The turbomachine 74 includes a compressor 76 which, in this example, includes a rotor 78 and a stator 80. The compressor 76 is mechanically connected to a motor 82, and the turbomachine 74 is contained in a housing 84. Power is provided to the motor 82 from a power source (not shown), and the motor 82 drives the compressor 76. The compressor 76 draws air from around the heatsink 72 through a transition duct 86 disposed between the heatsink 72 and the turbomachine 74, compresses the air, drives the air along a length of the housing 84, and exhausts the air to the atmosphere. The aerodynamic configuration of the compressor 76 makes the turbomachine 74 capable of high flow rates up to about 35 liters per second and high pressures in excess of conventional fans of similar size. The turbomachine 74 provides air cooling as much as 15 times more effective than conventional fans while occupying about $\frac{1}{4}^{th}$ the space of a conventional fan with similar capabilities.

The various components of the cooling system 10 are connected by conduits through which the cooling fluid is circulated through the cooling system 10. A variety of fluids may be utilized as the cooling fluid including dielectric fluids, water based fluids and mixtures, or combinations thereof. The fluid pump 12 pumps cooling fluid through a package conduit 88 and to the electronics package 16. Returning to FIG. 2, the cooling fluid enters the input manifold 26 from the package conduit 88, and it is distributed through the input manifold 26 to channels 22 in the one or more cooling layers 20. As the cooling fluid passes through the channels 22, it absorbs heat from the surfaces of the channels 22. The heated cooling fluid flows from the channels 22 through the output manifold 28. Returning now to FIG. 1, the fluid flows from the output manifold 28 to the microcooler 14 through a cooler conduit 90. Optionally, the package conduit 88 may be split into a plurality of package conduits 88 and carry cooling fluid from the fluid pump 12 to a plurality of electronics packages 16 within an electronic device. The fluid is utilized to cool the plurality of electronics packages 16 as described above, and the heated cooling fluid flows through a plurality of cooler conduits 90, which may be joined into a single cooler conduit 90 before reaching the microcooler 14.

Heat from the cooling fluid is absorbed by the heatsink 72, and the heat migrates into the heatsink fins 92. The turbomachine 74 moves a volume of air across the surfaces of the heatsink fins 92, and through the turbomachine 74 as described above, thus rejecting the heat into the atmosphere. The cooling fluid then returns to the fluid pump 12 via a pump conduit 94. This process continues as a closed loop, maintaining an operating temperature of the electronics package 16, and thus preserving its functionality.

Examples of the cooling system 10 described above provide higher flow rates and pressures resulting in the capability to cool heat fluxes of greater than about 750 W/cm$^2$ and to achieve heat transfer rates of over about 30,000 W/m$^2$/° K. Additionally, the cooling system 10 is smaller and lighter in weight allowing space within an electronic device to be utilized for other functions.

While embodiments of the invention have been described above, it will be understood that those skilled in the art, both now and in the future, may make various improvements and enhancements which fall within the scope of the claims which follow. These claims should be construed to maintain the proper protection for the invention first described.

The invention claimed is:

1. A system for cooling an electronics package, the system comprising:
   one or more cooling layers interspersed with layers of electronics in the electronics package, wherein each layer of electronics is disposed overlapping a corresponding cooling layer among the one or more cooling layers, each cooling layer comprising:
   an array of cooling channels formed in a substrate;
   an input manifold including a plurality of input manifold arms, the input manifold distributing fluid to the array of cooling channels from a package conduit; and
   an output manifold including a plurality of output manifold arms, the output manifold carrying fluid away from the array of cooling channels into a cooler conduit;
   wherein the array of cooling channels extend continuously from the input manifold to the output manifold along the substrate;
   a fluid pump in operable communication with the input manifold, the fluid pump capable of urging fluid through the system; and
   a microcooler assembly comprising:
   a heat sink in operable communication with the output manifold via the cooler conduit and in operable communication with the fluid pump via a pump conduit; and
   a turbo machine for moving a volume of air across the heat sink to dissipate heat to ambient air.

2. The system of claim 1 wherein the plurality of input manifold arms extend perpendicularly to the array of cooling channels.

3. The system of claim 1 wherein the plurality of output manifold arms extend perpendicularly to the array of cooling channels.

4. The system of claim 1 wherein the plurality of input manifold arms are interspersed with the plurality of output manifold arms.

5. The system of claim 1 wherein the fluid pump comprises a viscous shear pump.

6. The system of claim 5 wherein the viscous shear pump includes a rotable element having herringbone spiral grooves therein.

7. The system of claim 1 wherein the fluid pump comprises a synthetic jet pump.

8. The system of claim 7 wherein the synthetic jet pump comprises:
   an input chamber;
   an output chamber;
   a plurality of stacked pump chambers defined by a plurality of deformable membranes, the pump chambers disposed between the input chamber and the output chamber;
   a plurality of input valves, each input valve disposed to define an entrance to the corresponding pump chamber;
   a plurality of output valves, each output valve disposed to define an exit from the corresponding pump chamber; and
   an actuator disposed at each deformable membrane.

9. The system of claim 8 wherein a spacer is included between adjacent pump chambers.

10. The system of claim 1 wherein the turbomachine is capable of moving about 35 liters of air per second.

11. The system of claim 1 wherein each cooling channel has a diameter of less than 3 millimeters.

12. The system of claim 11 wherein each cooling channel has a diameter of less than 300 microns.

13. The system of claim 1 wherein each cooling channel includes an interior surface treatment to improve performance of the system.

14. A method for cooling an electronics package, the method comprising:
pumping fluid from a fluid pump through a package conduit to an input manifold disposed at the electronics package;
distributing the fluid from the input manifold through a plurality of input manifold arms to an array of cooling channels disposed in one or more cooling layers interspersed with one or more electronics layers in the electronics package; wherein each layer of electronics is disposed overlapping a corresponding cooling layer among the one or more cooling layers;
absorbing heat in the electronics package by forcing the fluid through the array of cooling channels formed in a substrate of each cooling layer;
collecting the fluid from the array of cooling channels in a plurality of output manifold arms interspersed with the input manifold arms and further collecting the fluid into an output manifold; wherein the array of cooling channels extend continuously from the input manifold to the output manifold along the substrate;
urging the fluid through a cooler conduit to a heatsink portion of a microcooler assembly comprising a turbomachine and the heatsink;
absorbing heat from the fluid into the heatsink;
radiating the heat from the heatsink to ambient air by utilizing the turbomachine to force a volume of air across the heat sink; and
returning the fluid from the heatsink to the fluid pump through a pump conduit.

15. The method of claim 14 wherein the fluid pump comprises a viscous shear pump.

16. The method of claim 14 wherein the fluid pump comprises a synthetic jet pump.

17. The method of claim 16 wherein the synthetic jet pump comprises:
an input chamber;
an output chamber;
a plurality of stacked pump chambers defined by a plurality of deformable membranes, the pump chambers disposed between the input chamber and the output chamber;
a plurality of input valves, each input valve disposed to define an entrance to a pump chamber;
a plurality of output valves, each output valve disposed to define an exit from a pump chamber; and
an actuator disposed at each deformable membrane.

18. The method of claim 14 wherein the turbo machine is capable of moving about 35 liters of air per second.

19. The method of claim 14 wherein each cooling channel includes an interior surface treatment to improve performance of the system.

20. The method of claim 14 wherein the fluid comprises one of a dielectric fluid, a water based fluid or mixture, or combinations thereof.

21. The system of claim 13, wherein the interior surface treatment comprises a plurality of protrusions extending from an inner wall of each cooling channel.

22. The system of claim 13, wherein the interior surface treatment comprises a plurality of cylindrically shaped protrusions extending from an inner wall of each cooling channel.

23. The system of claim 13, wherein the interior surface treatment comprises a plurality of concave dimples provided on an inner wall of each cooling channel.

24. The method of claim 14; comprising distributing the fluid through each cooling channel among the array of cooling channels and absorbing heat from a surface of each cooling channel.

25. The system of claim 1, wherein each cooling channel among the array of cooling channels is configured to distribute fluid and absorb heat from a surface of each cooling channel.

* * * * *

UNITED STATES PATENT AND TRADEMARK OFFICE
CERTIFICATE OF CORRECTION

| | | |
|---|---|---|
| PATENT NO. | : 7,969,734 B2 | Page 1 of 1 |
| APPLICATION NO. | : 11/649173 | |
| DATED | : June 28, 2011 | |
| INVENTOR(S) | : Arik et al. | |

It is certified that error appears in the above-identified patent and that said Letters Patent is hereby corrected as shown below:

In Column 3, Line 37, delete "he" and insert -- the --, therefor.

In Column 8, Line 30, in Claim 24, delete "14;" and insert -- 14 --, therefor.

Signed and Sealed this
Ninth Day of August, 2011

David J. Kappos
*Director of the United States Patent and Trademark Office*